United States Patent
Schulze et al.

(10) Patent No.: US 10,481,648 B2
(45) Date of Patent: Nov. 19, 2019

(54) SECURING AN EXPANSION CARD IN A COMPUTING DEVICE

(71) Applicant: Hewlett Packard Enterprise Development LP, Houston, TX (US)

(72) Inventors: James Jeffery Schulze, The Woodlands, TX (US); Kevin D. Conn, Montgomery, TX (US); Keith A. Sauer, Spring, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 139 days.

(21) Appl. No.: 15/009,126

(22) Filed: Jan. 28, 2016

(65) Prior Publication Data

US 2017/0220080 A1 Aug. 3, 2017

(51) Int. Cl.
| | | |
|---|---|---|
| *H05K 5/00* | (2006.01) | |
| *G06F 1/18* | (2006.01) | |
| *H05K 5/02* | (2006.01) | |

(52) U.S. Cl.
CPC ........... *G06F 1/185* (2013.01); *H05K 5/0221* (2013.01)

(58) Field of Classification Search
None
See application file for complete search history.

(56) References Cited

U.S. PATENT DOCUMENTS

| | | | | |
|---|---|---|---|---|
| 5,340,340 A * | 8/1994 | Hastings | ................. | G06F 1/181 312/223.1 |
| 5,673,172 A * | 9/1997 | Hastings | ................. | G06F 1/182 361/679.34 |
| 7,059,182 B1 * | 6/2006 | Ragner | ................. | H05K 5/0086 73/200 |
| 8,514,585 B2 | 8/2013 | Zhang et al. | | |
| 2003/0193775 A1 * | 10/2003 | Chang | ................. | G06F 1/184 361/679.4 |
| 2006/0034048 A1 * | 2/2006 | Xu | ................. | G06F 1/184 361/679.32 |
| 2008/0057781 A1 * | 3/2008 | Chen | ................. | H01R 13/639 439/577 |
| 2008/0305687 A1 * | 12/2008 | Zhang | ................. | G11B 33/12 439/638 |
| 2009/0059506 A1 * | 3/2009 | Yeh | ................. | G06F 1/187 361/679.34 |

(Continued)

FOREIGN PATENT DOCUMENTS

WO  WO-2015/047299 A1  4/2015

OTHER PUBLICATIONS

Designspark, "M.2 (NGFF) Connectors—TE Connectivity," Blog posted by Veronica Caluijten, retrieved Apr. 12, 2015 at http://www.rs-online.com/designspark/electronics/knowledge-item/m-2-ngff-connectors-te-connectivity, 3 pages.

*Primary Examiner* — Courtney L Smith
*Assistant Examiner* — Rashen E Morrison
(74) *Attorney, Agent, or Firm* — Brooks, Cameron & Huebsch, PLLC

(57) ABSTRACT

Example techniques for securing an expansion card in a computing device are disclosed. An example method includes securing a mounting bracket within the computing device. An adjustable retention clip is installed in a preferred location at the mounting bracket. An expansion card is then installed in a space created by the adjustable retention clip and the mounting bracket, and the expansion card is secured to the adjustable retention clip.

17 Claims, 6 Drawing Sheets

(56) References Cited

U.S. PATENT DOCUMENTS

| | | |
|---|---|---|
| 2010/0153608 A1 | 6/2010 | Olesiewicz et al. |
| 2010/0315774 A1 | 12/2010 | Walker et al. |
| 2012/0104222 A1* | 5/2012 | Ding .................. G06F 1/187 248/634 |
| 2013/0279129 A1* | 10/2013 | Xie ..................... G06F 1/16 361/752 |
| 2014/0111931 A1 | 4/2014 | Casserly et al. |

* cited by examiner

100

200

200

SECURING AN EXPANSION CARD IN A COMPUTING DEVICE

BACKGROUND

Computer technology is becoming more sophisticated as more storage drives, expansion cards, accessory cards, and the like are connected to printed circuit boards of servers and computing devices. As a result, enterprise adoption of new data storage, processing, and analytics has become widespread. More storage drives and expansion cards may result in increased memory capacity or density, and increased data processing capability. The ability to mix and match expansion cards of various size and other devices within a typical server system can be limited based on the specifications of the cards and devices, as well as by other restraints imposed by the configuration of the server system itself.

DESCRIPTION OF THE DRAWINGS

Certain examples are described in the following detailed description and in reference to the drawings, in which.

DETAILED DESCRIPTION

Figure 1:
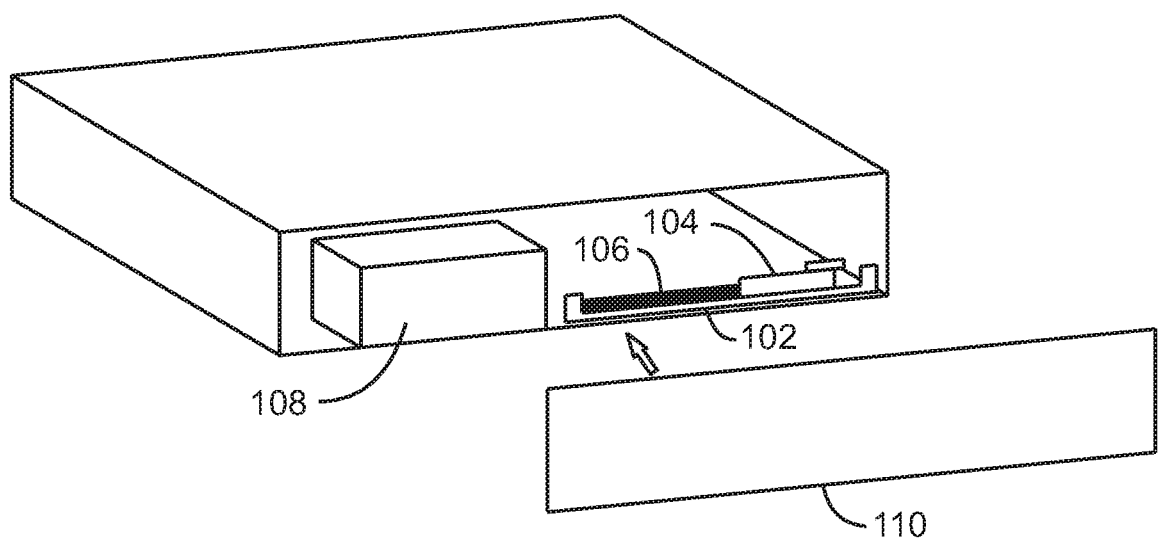
FIG. 1 is a perspective view of a server including an example mounting bracket and adjustable retention clip.

Data processing can be accomplished by systems that include single servers, multiple servers arranged in a server rack, multiple server racks in a data processing center, and so forth. Servers and other computing devices may have a processing component and a tray having storage drives such as hard disk drives (HDDs) and/or solid state drives (SSDs). Servers and other computing devices may also include expansion cards, accessory cards, adapter cards and the like that are configured to connect to a printed circuit board (PCB) with internal mounts and associated connectors. The techniques described herein illustrate the ability to support multiple expansion cards with various lengths, such as M.2 cartridges varying in size, for example, using a standard connector location on the PCB. The M.2 specification is formerly known as the Next Generation Form Factor (NGFF) standard for expansion cards mounted within a computing device. The M.2 specification allows for different expansion card or module widths and lengths, and is particularly suited, in some examples, for SSDs.

The number of storage drives used in a typical server is rising, and different form factors are utilized. For instance, the small form factor (SSF) disk drive may facilitate increasing the number of HDDs in a server tray. For some servers, instead of 12 large form factor (LFF) disk drives, a server tray can now accommodate 24 SSF disk drives, for example. In addition, the M.2 specification has slowly been gaining prominence in the server market. M.2 cartridges are becoming more lucrative and useful to provide as supported options or standard boot devices and storage in servers. The M.2 cartridges come in different capacities and each capacity is a different length.

Current solutions for mounting an expansion card include a single standoff mounted to sheet metal or the printed circuit board (PCB) that the cartridge sits on in a recess at the end of the card and then secured with a single screw at the opposite, free end. The single standoff is in a fixed location and can only support one length of a particular M.2 cartridge. Due to the mounting method of securing the cartridge at the end of the card, a product has typically had to pick a specific length to use and then support only that length.

Examples described herein use an adjustable, snap-in clip design with support for multiple lengths of M.2 cartridges, for example 42 millimeters (mm), 80 mm, or 110 mm to be used on a single PCB connector location. In examples, a two-part design is used to support an adjustable mounting feature, one of which is a snap-in removable part that can be moved to different locations to support the different M.2 cartridge lengths, and the other is a mounting bracket on the PCB.

The technology described herein is related to an example method and system for securing an expansion card in a computing device. The system can include mounting a mounting bracket within the computing device. In some examples, a snap-in retention clip can be installed in a preferred location at the mounting bracket. Additionally, an expansion card can be installed in a gap created by the snap-in, adjustable retention clip and the mounting bracket, wherein the expansion card is secured to the snap-in retention clip.

FIG. 1 is a perspective view of a server 100 including an example mounting bracket 102 and adjustable retention clip 104 as described herein. The mounting bracket 102 can be a plastic or metal insert, for example, or some other suitable material that is secured to the PCB (not shown) of the server 100. The mounting bracket 102 can have various indentations or holes for securing the adjustable retention clip 104 at multiple positions on the PCB. In some examples, the adjustable retention clip 104 includes a snap-in feature to secure the adjustable retention clip 104 to a particular space on the mounting bracket 102.

The adjustable retention clip 104 is mounted on the mounting bracket 102 to create an area between each component to fit an expansion card 106. The space created by the adjustable retention clip 104 and the mounting bracket 102 can be a preferred size based on the particular expansion card 106 that is to be connected to the server 100. In examples, the expansion card 106 can be a storage device that uses the M.2 specification as a connector to the PCB of the server 100. In other examples, the expansion card 106 can be a storage device that uses the micro serial advanced technology attachment (mSATA) specification as the connector. The expansion card 106 is not limited to storage devices, but can be a dense memory module, among other examples.

The example server 100 includes computing components 108. The computing components 108 can include processors, memory, bus connections, cache storage, network controllers, and other circuitry to name a few examples, for the operation of the server 100. The processor may be a central processing unit (CPU) or other type of processor, and may execute code or instructions stored on the memory device and/or expansion card 106 if a storage device. The memory device may include nonvolatile memory (e.g., read only memory or ROM), volatile memory (e.g., random access memory or RAM), and so forth. Further, memory (e.g., cache or processor memory) may be directly associated with the processor. The computing components 108 can also include a chip set, which may provide interconnects between the processors and other computing components 108. Example interconnects may include Peripheral Component Interconnect Express (PCIe), Fibre Channel, Ethernet, and the like. In some examples, a bus may be used by computing components 108 instead of, or in addition to, the example interconnects.

As illustrated in FIG. 1, the server 100 is shown with a side panel 110 removed from a side of the server 100. The side panel 110 is removed to show the inside of the example server 100. The illustration in FIG. 1 shows the mounting bracket 102, the adjustable retention clip 104, the expansion card 106, and the computing components 108 may be enclosed or partially enclosed by a chassis of the server 100 which may include framing and/or siding made of sheet metal or other materials.

The block diagram of FIG. 1 is not intended to indicate that the server 100 is to include all of the components shown in FIG. 1. Further, any number of additional components may be included within the server 100, depending on the details of the server 100 design and the expansion card requirements and accessibility. For example, the items discussed are not limited to the functionalities mentioned, but the functions could be done in different places, or by different devices, if at all.

Figure 2A:
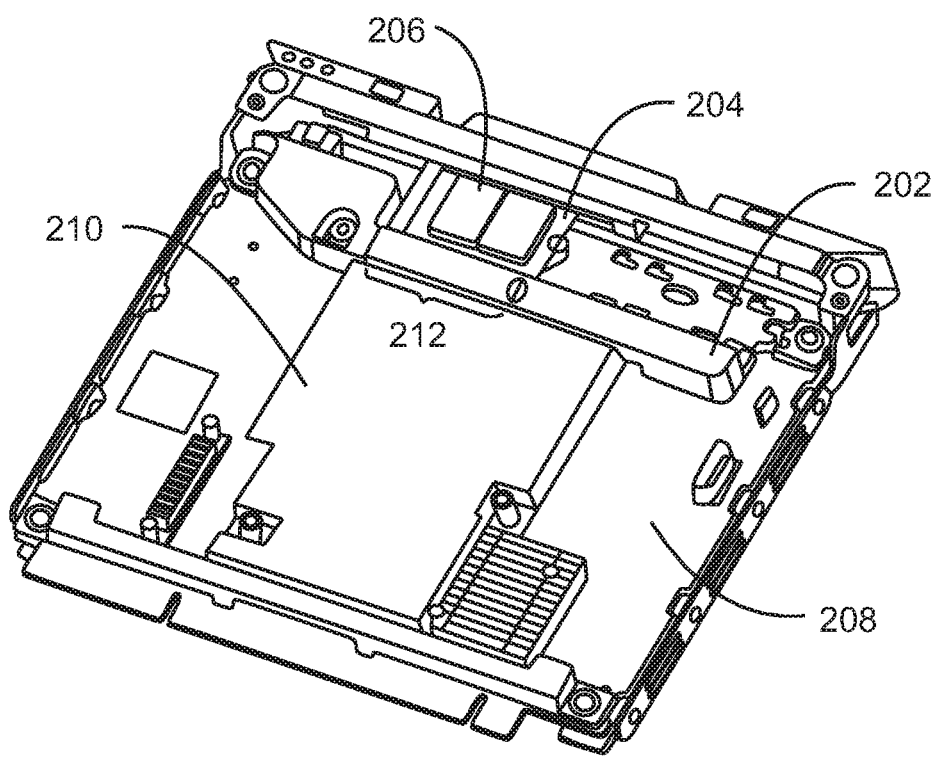
FIGS. 2A, 2B, and 2C illustrate perspective views of an example computing device including a mounting bracket and adjustable retention clip as described herein.
Figure 2B:
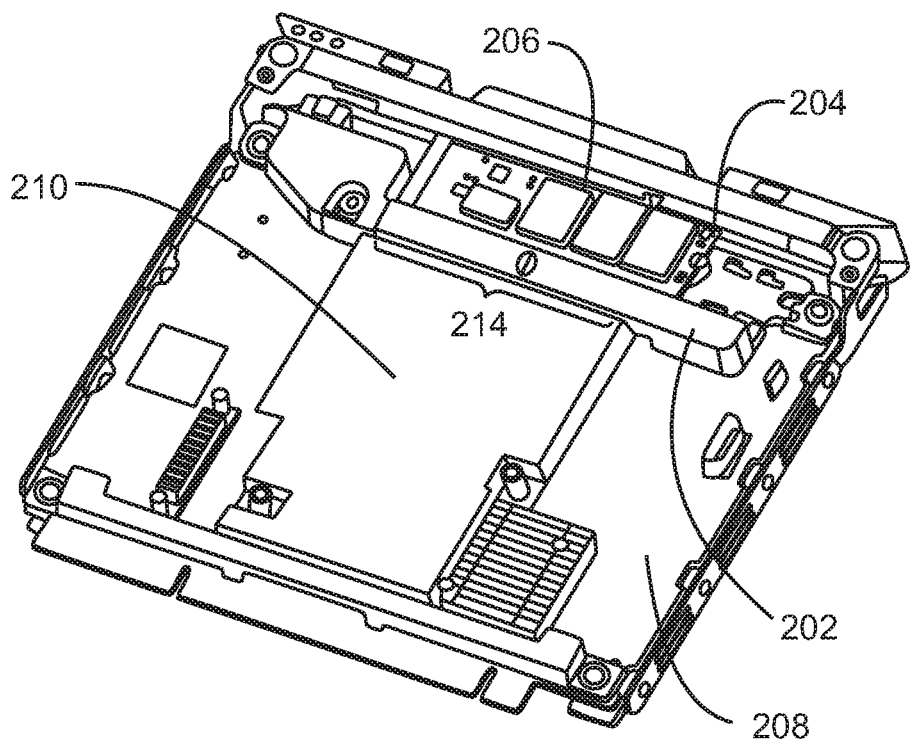
Figure 2C:
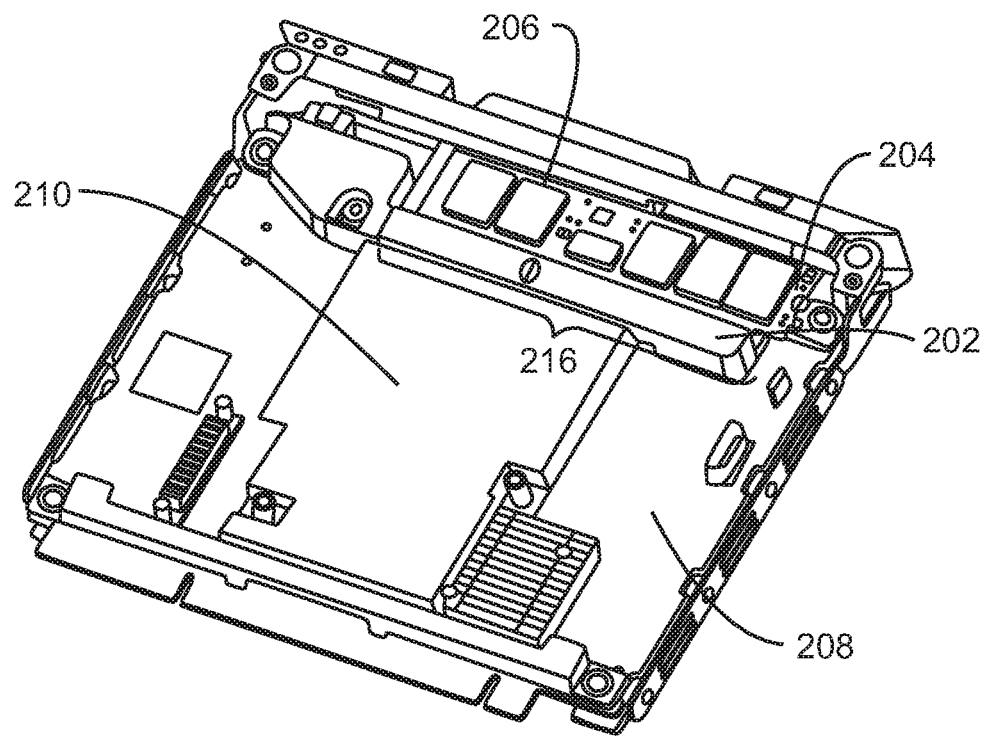

FIGS. 2A, 2B, and 2C illustrate perspective views of an example computing device 200 including a mounting bracket 202 and adjustable retention clip 204 as described herein. The computing device 200 can be a server or server cartridge, for example, the ProLiant™ server cartridge for use in the Moonshot™ System by HPE®, or similar servers or server cartridges. The mounting bracket 202 and adjustable retention clip 204 can be spaced apart to create a preferred area within which an expansion card 206 is configured to fit. The preferred area can thus be changed to accommodate an expansion card 206 of particular dimension.

FIG. 2A shows the mounting bracket 202 connected to a PCB 208 including a smaller-size expansion card 206. The PCB 208 can be used to support and electrically connect computing components 210 of the computing device 200. The smaller-size expansion card 206 can use, for example, the M.2 specification to connect with the PCB 208 and computing components 210. The illustration in FIG. 2A shows an example space or distance 212 created by the placement of the adjustable retention clip 204 in a near section of the mounting bracket 202. The adjustable retention clip 204 is shown in this example to accommodate a space or distance 212 of about 42 mm in order to secure a smaller-size expansion card 206, such as an M.2 cartridge, for example, that is about 42 mm in length.

FIG. 2B shows the mounting bracket 202 connected to a PCB 208 including a medium-size expansion card 206. The PCB 208 can be to support and electrically connect computing components 210 of the computing device 200. The medium-size expansion card 206 can use, for example, the M.2 specification to connect with the PCB 208 and computing components 210. The illustration in FIG. 2B shows an example space or distance 214 created by the placement of the adjustable retention clip 204 in a middle section of the mounting bracket 202. The adjustable retention clip 204 is shown in this example to accommodate a space or distance 212 of about 80 mm in order to secure a medium-size expansion card 206, such as an M.2 cartridge, for example, that is about 80 mm in length.

FIG. 2C shows the mounting bracket 202 connected to a PCB 208 including a larger-size expansion card 206. The PCB 208 can be to support and electrically connect computing components 210 of the computing device 200. The larger-size expansion card 206 can use, for example, the M.2 specification to connect with the PCB 208 and computing components 210. The illustration in FIG. 2C shows an example space or distance 216 created by the placement of the adjustable retention clip 204 in a far section of the mounting bracket 202. The adjustable retention clip 204 is shown in this example to accommodate a space or distance 212 of about 110 mm in order to secure an expansion card 206, such as an M.2 cartridge, for example, that is about 110 mm in length.

The perspective views of the computing device 200 in FIGS. 2A, 2B, and 2C are not intended to indicate that the computing device 200 is to include all of the components shown in FIGS. 2A, 2B, and 2C. Further, any number of additional components may be included within the computing device 200, depending on the details of the computing device 200 design and the expansion card requirements and accessibility. For example, the items discussed are not limited to the functionalities mentioned, but the functions could be done in different places, or by different devices, if at all. Further, the example area between the mounting bracket 202 and adjustable retention clip 204 is not limited to the spaces or distances 212, 214, and 216 described; other spaces or distances can be used depending on the type and size of expansion card 206. For example, the configuration of the backplane of a server system, or the computing components 210 within a computing device 200, or the preferences of a manufacturer can determine the available areas between the adjustable retention clip 204 and mounting bracket 202.

Figure 3:
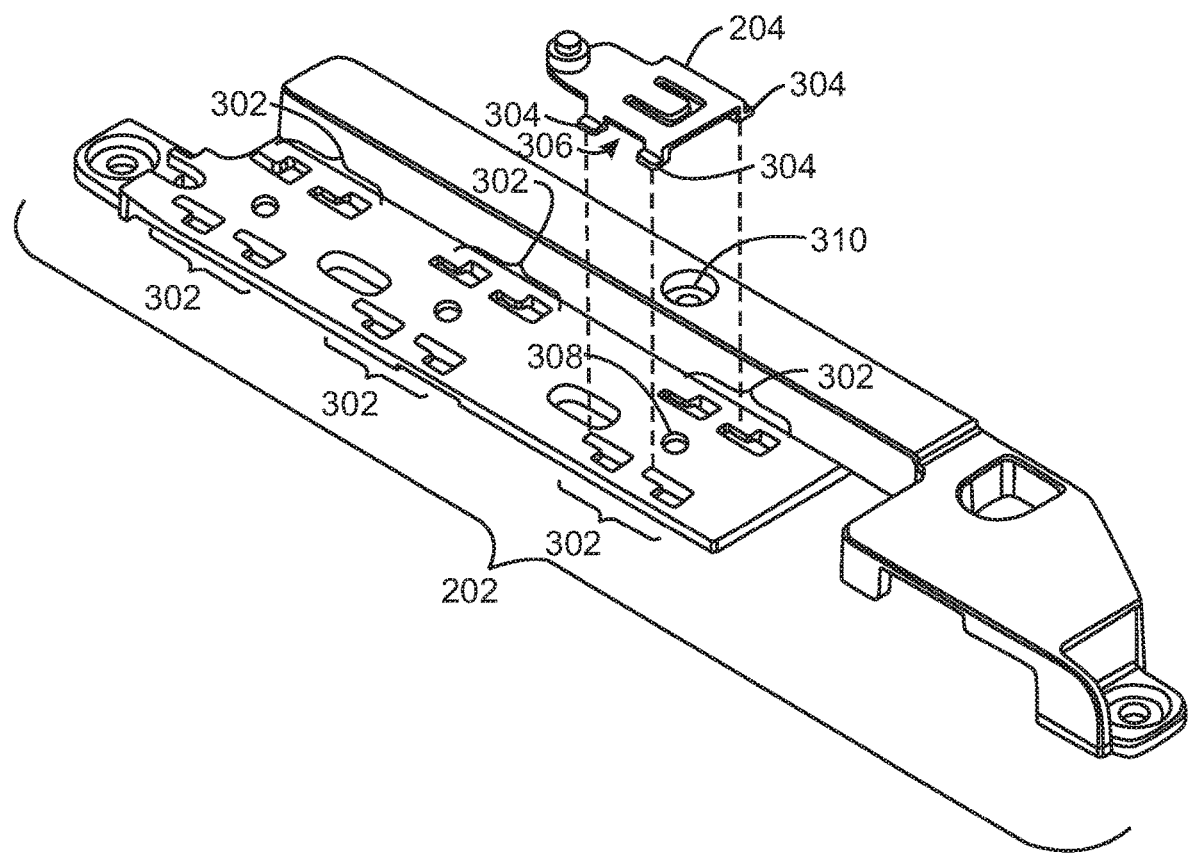
FIG. 3 is an illustration showing an exploded view of the example mounting bracket and adjustable retention clip.

FIG. 3 is an illustration showing an exploded view of the example mounting bracket 202 and adjustable retention clip 204. As disclosed herein, an example of a server may include a mechanism for securing an expansion card, such as cards using the M.2 design specification for internally mounted computer expansion cards varying in size. The design is a two piece assembly. One piece is the mounting bracket 202, which can be plastic, metal, or some other suitable material, that is secured on the circuit board that contains an M.2 connector, for example. The second piece is a snap-in plastic retention piece, i.e., the adjustable retention clip 204, which can be installed or removed in different mounting locations 302 on the mounting bracket 202.

In examples, each set of mounting locations 302 are to secure the adjustable retention clip at a length corresponding to a different expansion card. The adjustable retention clip 204 can have a set of mounting guides 304 and a snap-in feature 306. To install the adjustable retention clip 204, the mounting guides 304 are inserted and/or slid into a groove of the set of mounting locations 302. In examples, the snap-in feature 306 on the adjustable retention clip 204 can also be connected by a detent or snap 308 that connects to the snap-in feature 306. The snap-in feature 306 and snap 308 allow for further stability of the adjustable retention clip 204. In examples, securing screws 310 can be provided in the base of the mounting bracket 202. The securing screws 310 can be, for example, M.2 securing screws used when an expansion card like an M.2 cartridge is installed. The securing screws 310 are to fasten an expansion card that are variable in length and type, for example, to the adjustable retention clip 204.

The illustration of FIG. 3 is not intended to indicate that the mounting bracket 202 and adjustable retention clip 204 are to include all of the components shown in FIG. 3. Further, any number of additional components may be included, depending on the details of the mounting bracket 202 and adjustable retention clip 204 design and the expansion card requirements and accessibility. For example, the items discussed are not limited to the functionalities mentioned, but the functions could be done in different places, or by different devices, if at all. Additionally, in examples of the mounting bracket 202 and adjustable retention clip 204, no extra parts are needed in order to properly secure expansion cards of different length and size to a circuit board.

Figure 4:
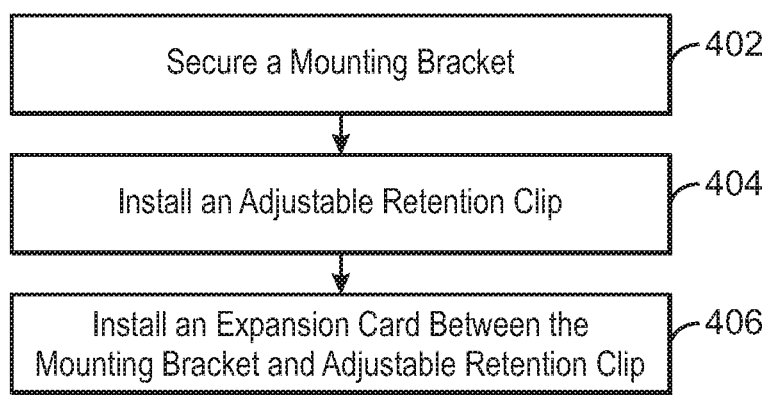
FIG. 4 is a process flow diagram of an example method for securing expansion cards of various length in a computing device using the example adjustable retention clip as described herein.

FIG. 4 is a process flow diagram of an example method 400 for securing expansion cards of various length in a computing device using the example adjustable retention clip as described herein. The method 400 begins at block 402 where a mounting bracket is secured to the PCB within an example computing device. In examples, the mounting bracket can be fastened to the PCB within the computing device by using screws. In some examples, the mounting bracket can be fastened to the PCB by using an adhesive. In other examples, the mounting bracket can snap in to the PCB at a specific location by a snap-in feature.

The method 400 continues at block 404 where an adjustable retention clip is installed in a preferred location at the mounting bracket. The mounting bracket includes separate groups of guides punched into the mounting bracket. The groups of guides are each configured to accept the adjustable retention clip in a particular location, such that an area of space created between the adjustable retention clip and the mounting bracket supports a particular expansion card. In examples, each location of a group of guides corresponds to a different M.2 cartridge length. In examples, the adjustable retention clip has a detent flange that secures the clip in place on the mounting bracket without any cartridge installed. When an example expansion card is added, the back flange of the snap-in clip of the adjustable retention clip has a support ledge that positions the expansion card to a suitable height above the PCB. The support ledge can also be a standoff.

The method 400 concludes at block 406 where an expansion card is installed in a space created by the adjustable retention clip and the mounting bracket. The technique for securing the expansion cards can include positioning of the adjustable retention clip that has a snap-in mechanism to connect to the mounting bracket. In examples, the expansion card is secured to the adjustable retention clip by use of a thread-forming screw. In examples, the screw can be included with the mounting bracket, provided in the base of the mounting bracket, and used to finish installing an expansion card. The adjustable retention clip and mounting bracket ultimately secure an expansion card above the top layer of a PCB, and so the expansion card is connected to a computing device, for example, through a port. In examples, a guide of the adjustable retention clip slides in (through) a number of recesses in each side of the mounting bracket. Other configurations may be accommodated to connect the guides of the adjustable retention clip into side recesses or mounting locations of the mounting bracket.

In examples, the computing device can be a server or server cartridge. The configuration of the backplane and the PCB layout may determine the type of expansion card that is secured by method 400. A processing component located within the sever or server cartridge may include one or more processors, one or more memory devices, and other circuitry. The processor may execute code or instructions stored on the memory device, expansion card, and/or other storage devices, and other code or instructions.

The adjustable retention clip and mounting bracket design allows a greater flexibility in, for example, M.2 cartridge support. For example, during the design or concept phase a specific M.2 cartridge does not need to be decided upon to be supported. This design can allow any M.2 cartridge length, such as 42 mm, 80 mm, and 110 mm, to be installed and a user can change to a different capacity in the future to fit their needs. The same adjustable retention clip piece is movable and can be used for any length cartridge, thereby eliminating use of a different length bracket for different cards. This design allows maximum component space on a server cartridge PCB by using the low profile adjustable retention clip mounted above the top layer of the PCB.

By providing compute units and other components that match the characteristics of the application being deployed, power and space requirements are reduced. The system for securing expansion cards of various length described herein delivers efficiency and scalability by aligning the right amount of compute, memory, and storage for specific workloads. The current techniques are particularly useful when delivered in a dense, and energy efficient package that allows for customizability.

While the present techniques may be susceptible to various modifications and alternative forms, the exemplary examples discussed above have been shown only by way of example. It is to be understood that the techniques are not intended to be limited to the particular examples disclosed herein. Indeed, the present techniques include all alternatives, modifications, and equivalents falling within the scope of the present techniques.

What is claimed is:

1. A system for securing an expansion card, comprising:
a printed circuit board;
an adjustable retention clip that includes mounting guides and a snap-in detent flange; and
a bracket affixed to a first surface of the printed circuit board, the bracket including a plurality of mounting locations at which the adjustable retention clip can be installed, each of the plurality of mounting locations including a set of grooves and a detent,
wherein, for each of the plurality of mounting locations, when the adjustable retention clip is installed at the mounting location:
the set of grooves of the mounting location engage with the mounting guides to attach the adjustable retention clip to the bracket,
the detent of the mounting location engages with the snap-in detent flange, and
the mounting bracket and the adjustable retention clip define a space in which the expansion card can be installed on the printed circuit board parallel to the first surface with the adjustable retention clip engaging the expansion card to secure it to the printed circuit board, and
wherein the bracket includes a first portion that includes the plurality of mounting locations and that is located between the expansion card and the printed circuit board when the expansion card is installed on the printed circuit board.

2. The system of claim 1,
wherein, for each of the plurality of mounting locations, when the adjustable retention clip is installed at the mounting location, the detent of the mounting location engages with the snap-in detent flange to secure the adjustable retention clip at the respective mounting location.

3. The system of claim 1,
wherein the expansion card comprises an M.2 cartridge.

4. The system of claim 1,
wherein the space defined by the mounting bracket and the adjustable retention clip in which the expansion card can be installed changes sizes based on which one of the plurality of mounting locations the adjustable retention clip is attached to.

5. The system of claim 4,
wherein the plurality of mounting locations are located such that the sizes of the space defined by the mounting bracket and the adjustable retention clip in which the expansion card can be installed correspond to different M.2 cartridge sizes.

6. The system of claim 1,
wherein the adjustable retention clip includes a support ledge that is to, when the expansion card is installed on the printed circuit board, position the expansion card to a suitable height above the printed circuit board.

7. The system of claim 1,
wherein the bracket includes a second portion that is higher above the printed circuit board than the first portion and that forms a boundary of the space in which the expansion card is to be installed.

8. A method, comprising:
providing the system of claim 1;
installing the adjustable retention clip in one of the plurality of mounting locations; and
installing the expansion card in the space defined by the mounting bracket and the adjustable retention clip.

9. A system for securing an expansion card, comprising:
a printed circuit board having a connector in which the expansion card can be installed;
an adjustable retention clip that includes mounting guides and a snap-in detent flange; and
a bracket connected to the printed circuit board, the bracket including a plurality of mounting locations at which the adjustable retention clip can be installed, each of the plurality of mounting locations including a set of grooves and a detent,
wherein, for each of the plurality of mounting locations, when the adjustable retention clip is installed at the mounting location:
the set of grooves of the mounting location engage with the mounting guides to attach the adjustable retention clip to the bracket,
the detent of the mounting location engages with the snap-in detent flange to secure the adjustable retention clip at the respective mounting location, and
the mounting bracket and the adjustable retention clip define a space in which the expansion card can be installed on the printed circuit board with one end of the expansion card connecting to the connector and an opposite end of the expansion card being engaged by the adjustable retention clip, and
wherein the space defined by the mounting bracket and the adjustable retention clip in which the expansion card can be installed changes sizes based on which one of the plurality of mounting locations the adjustable retention clip is attached to, and the plurality of mounting locations are located such that the sizes of the space defined by the mounting bracket and the adjustable retention clip in which the expansion card can be installed correspond to different M.2 cartridge sizes.

10. The system of claim 9,
wherein the expansion card comprises an M.2 cartridge.

11. The system of claim 9,
wherein the adjustable retention clip includes a support ledge that is to, when the expansion card is installed on the printed circuit board, position the expansion card to a suitable height above the printed circuit board.

12. The system of claim 9,
wherein the bracket includes a first portion that includes the plurality of mounting locations and that is located between the expansion card and the printed circuit board when the expansion card is installed on the printed circuit board.

13. A system for securing an expansion card, comprising:
a printed circuit board having a connector in which the expansion card can be installed;
an adjustable retention clip that includes mounting guides and a snap-in detent flange; and
a bracket connected to the printed circuit board, the bracket including a plurality of mounting locations at which the adjustable retention clip can be installed, each of the plurality of mounting locations including a set of grooves and a detent,
wherein, for each of the plurality of mounting locations, when the adjustable retention clip is installed at the mounting location:
the set of grooves of the mounting location engage with the mounting guides to attach the adjustable retention clip to the bracket,
the detent of the mounting location engages with the snap-in detent flange to secure the adjustable retention clip at the respective mounting location, and
the mounting bracket and the adjustable retention clip define a space in which the expansion card can be installed on the printed circuit board with one end of the expansion card connecting to the connector and an opposite end of the expansion card being engaged by the adjustable retention clip,
wherein the bracket includes a first portion that includes the plurality of mounting locations and that is located between the expansion card and the printed circuit board when the expansion card is installed on the printed circuit board, and
wherein the bracket includes a second portion that is higher above the printed circuit board than the first portion and that forms a boundary of the space in which the expansion card is to be installed.

14. A method, comprising:
providing the system of claim 9;
installing the adjustable retention clip in one of the plurality of mounting locations; and
installing the expansion card in the space defined by the mounting bracket and the adjustable retention.

15. A system for securing an expansion card, comprising:
a printed circuit board;
an adjustable retention clip that includes mounting guides and a snap-in detent flange; and
a bracket connected to the printed circuit board, the bracket including a plurality of mounting locations at which the adjustable retention clip can be installed, each of the plurality of mounting locations including a set of grooves and a detent,
wherein, for each of the plurality of mounting locations, when the adjustable retention clip is installed at the mounting location:
the set of grooves of the mounting location engage with the mounting guides to attach the adjustable retention clip to the bracket,
the detent of the mounting location engages with the snap-in detent flange, and
the mounting bracket and the adjustable retention clip define a space in which the expansion card can be installed on the printed circuit board with the adjustable retention clip securing the expansion card, and the space defined by the mounting bracket and the adjustable retention clip in which the expansion card can be installed changes sizes based on which one of the plurality of mounting locations the adjustable retention clip is attached to, the plurality of mounting locations are located such that the sizes of the space correspond to different M.2 cartridge sizes, wherein the adjustable retention clip includes a support ledge that is to, when the expansion card is installed on the printed circuit board, position the expansion card to a suitable height above the printed circuit board.

16. A method, comprising:

providing the system of claim 15;

installing the adjustable retention clip in one of the plurality of mounting locations; and installing the adjustable retention clip in the space defined by the mounting bracket and the adjustable retention.

17. A system for securing an expansion card, comprising:

a printed circuit board;

an adjustable retention clip that includes mounting guides and a snap-in detent flange; and a bracket affixed to the printed circuit board, the bracket including a plurality of mounting locations at which the adjustable retention clip can be installed, wherein each of the plurality of mounting locations includes a set of grooves and a detent that are to engage with the mounting guides and the snap-in detent flange, respectively, when the adjustable retention clip is installed at the mounting location, such that the expansion card can be installed in the printed circuit board with the adjustable retention clip securing the expansion card;

wherein the adjustable retention clip includes a support ledge that is to, when the expansion card is installed on the printed circuit board, position an end of the expansion card to a suitable height above the printed circuit board.

* * * * *